(12) United States Patent
Lee et al.

(10) Patent No.: US 9,065,398 B2
(45) Date of Patent: Jun. 23, 2015

(54) AMPLIFYING CIRCUIT CAPABLE OF SUPPRESSING SPIKES OF AN AUDIO SIGNAL

(71) Applicants: Yung-Ming Lee, New Taipei (TW); Ming-Chung Li, Taipei (TW)

(72) Inventors: Yung-Ming Lee, New Taipei (TW); Ming-Chung Li, Taipei (TW)

(73) Assignee: Princeton Technology Corporation, New Taipei (TW)

( * ) Notice: Subject to any disclaimer, the term of this patent is extended or adjusted under 35 U.S.C. 154(b) by 440 days.

(21) Appl. No.: 13/671,524

(22) Filed: Nov. 7, 2012

(65) Prior Publication Data

US 2013/0156232 A1 Jun. 20, 2013

(30) Foreign Application Priority Data

Dec. 15, 2011 (TW) .............................. 100146620 A

(51) Int. Cl.
| | |
|---|---|
| H03F 1/34 | (2006.01) |
| H03F 3/217 | (2006.01) |
| H03F 3/38 | (2006.01) |
| H03F 1/02 | (2006.01) |
| H03F 1/52 | (2006.01) |
| H03F 3/185 | (2006.01) |
| H03F 1/32 | (2006.01) |
| H03K 7/08 | (2006.01) |

(52) U.S. Cl.
CPC ................ *H03F 1/342* (2013.01); *H03F 3/217* (2013.01); *H03F 3/38* (2013.01); *H03F 1/523* (2013.01); *H03F 3/2171* (2013.01)

(58) Field of Classification Search
USPC ............. 381/1, 94.8, 94.9, 106, 55, 120, 121; 330/260, 271, 291, 77, 81, 83, 207 A, 330/207 P See application file for complete search history.

(56) References Cited

U.S. PATENT DOCUMENTS

| | | | |
|---|---|---|---|
| 7,714,675 B2 | 5/2010 | Wang | |
| 7,956,681 B2 | 6/2011 | Guilherme | |
| 2006/0097784 A1* | 5/2006 | Lind | .............................. 330/251 |
| 2006/0238241 A1* | 10/2006 | Pearce et al. | .................... 330/10 |

FOREIGN PATENT DOCUMENTS

| | | |
|---|---|---|
| EP | 0 172 737 B1 | 7/1990 |
| TW | 201105029 | 2/2011 |

* cited by examiner

*Primary Examiner* — Duc Nguyen
*Assistant Examiner* — Yogeshkumar Patel
(74) *Attorney, Agent, or Firm* — Winston Hsu; Scott Margo

(57) ABSTRACT

An amplifying circuit capable of suppressing spikes of an audio signal includes an integration module, a comparison module, an output module, a feedback module, and a limiting module. The integration module is used for receiving an input signal and generating a first voltage signal corresponding to the input signal. The comparison module is coupled to the integration module for receiving the first voltage signal and a reference signal, and generating a comparison signal. The output module is coupled to the comparison module for generating an audio signal according to the comparison signal. The feedback module is coupled between the output module and the integration module for feeding back an output signal to the integration module. The limiting module is coupled between the feedback module and the integration module for limiting the comparison signal to be within a predetermined range.

8 Claims, 10 Drawing Sheets

AMPLIFYING CIRCUIT CAPABLE OF SUPPRESSING SPIKES OF AN AUDIO SIGNAL

BACKGROUND OF THE INVENTION

1. Field of the Invention

The present invention relates to an amplifying circuit, and particularly to an amplifying circuit that can suppress spikes of an audio signal outputted by the amplifying circuit.

2. Description of the Prior Art

Please refer to FIG. 1. FIG. 1 is a diagram illustrating an amplifying circuit 100 for outputting an audio signal according to the prior art. The amplifying circuit 100 includes an integration module 102, a comparison module 104, a triangular wave generator 106, an output module 109, a feedback resistor 111, and a low-pass filter 112. After the integration module 102 receives an input signal VIN, the integration module 102 generates and outputs a first voltage signal V1 to the comparison module 104. The comparison module 104 compares the first voltage signal V1 with a triangular wave signal VT generated by the triangular wave generator 106 to generate a comparison signal VPWM. The output module 109 generates an output signal VOUT according to the comparison signal VPWM, where the output signal VOUT is fed back to the integration module 102 through the feedback resistor 111. The low-pass filter 112 is coupled to the output module 109 for converting and filtering the output signal VOUT into an audio signal VA. A speaker 114 is coupled to the low-pass filter 112 for converting the audio signal VA into sound.

Please refer to FIG. 2A and FIG. 2B. FIG. 2A is a diagram illustrating the audio signal VA exhibiting spikes when an amplitude of the input signal VIN is increased gradually, and FIG. 2B is a diagram illustrating pulse width modulation of the output signal VOUT being stopped when the amplitude of the input signal VIN is increased gradually. As shown in FIG. 2A, when the amplitude of the input signal VIN is increased gradually, a positive half period and a negative half period of the audio signal VA may generate the spikes. Then, the spikes cause listeners to hear unpleasant noise when listening to music. In addition, as shown in FIG. 2B, the pulse width modulation of the output signal VOUT is stopped when the amplitude of the input signal VIN is increased gradually. That is to say, the output signal VOUT can stay at a high voltage or a low voltage. The output signal VOUT staying at the high voltage or the low voltage can be fed back to the integration module 102 through the feedback resistor 111, resulting in the first voltage signal V1 being saturated to the high voltage or the low voltage. Please refer to FIG. 3. FIG. 3 is a diagram illustrating the first voltage signal V1 outputted by the integration module 102 being saturated to the high voltage or the low voltage. As shown in FIG. 3, when the input signal VIN returns to a normal operation range, the first voltage signal V1 outputted by the integration module 102 needs a period of time to return to an amplitude range of the triangular wave signal VT from the high voltage or the low voltage, resulting in the audio signal VA exhibiting the spikes.

SUMMARY OF THE INVENTION

An embodiment provides an amplifying circuit capable of suppressing spikes of an audio signal. The amplifying circuit includes an integration module, a comparison module, an output module, a feedback module, and a limiting module. The integration module is used for receiving an input signal, and generating a first voltage signal corresponding to the input signal. The comparison module is coupled to the integration module for receiving the first voltage signal and a reference signal, and generating a comparison signal. The output module is coupled to the comparison module for generating the audio signal according to the comparison signal. The feedback module is coupled between the output module and the integration module for feeding back an output signal to the integration module. The limiting module is coupled between the integration module and the feedback module for limiting the comparison signal to be within a predetermined range.

The present invention provides an amplifying circuit capable of suppressing spikes of an audio signal. The amplifying circuit utilizes a limiting module to limit a first voltage signal outputted by an integration module to be within a predetermined range. That is to say, the first voltage signal outputted by the integration module is not saturated to a high voltage and ground. Therefore, the present invention can suppress spikes of an audio signal outputted by a low-pass filter of the amplifying circuit and reduce distortion of the audio signal. In addition, the present invention can also increase maximum output power of the amplifying circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
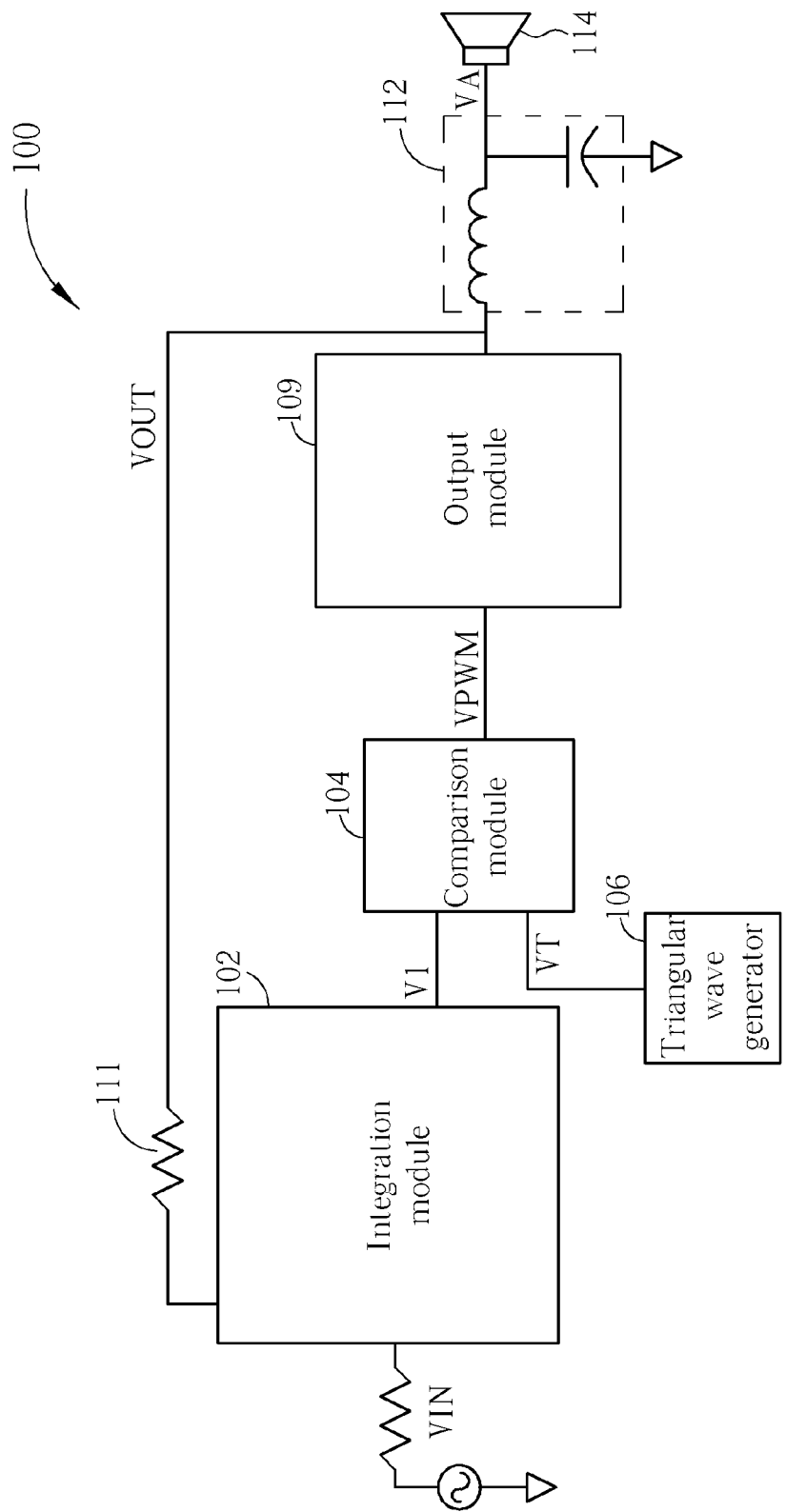
FIG. 1 is a diagram illustrating an amplifying circuit for outputting an audio signal according to the prior art.
Figure 2A:
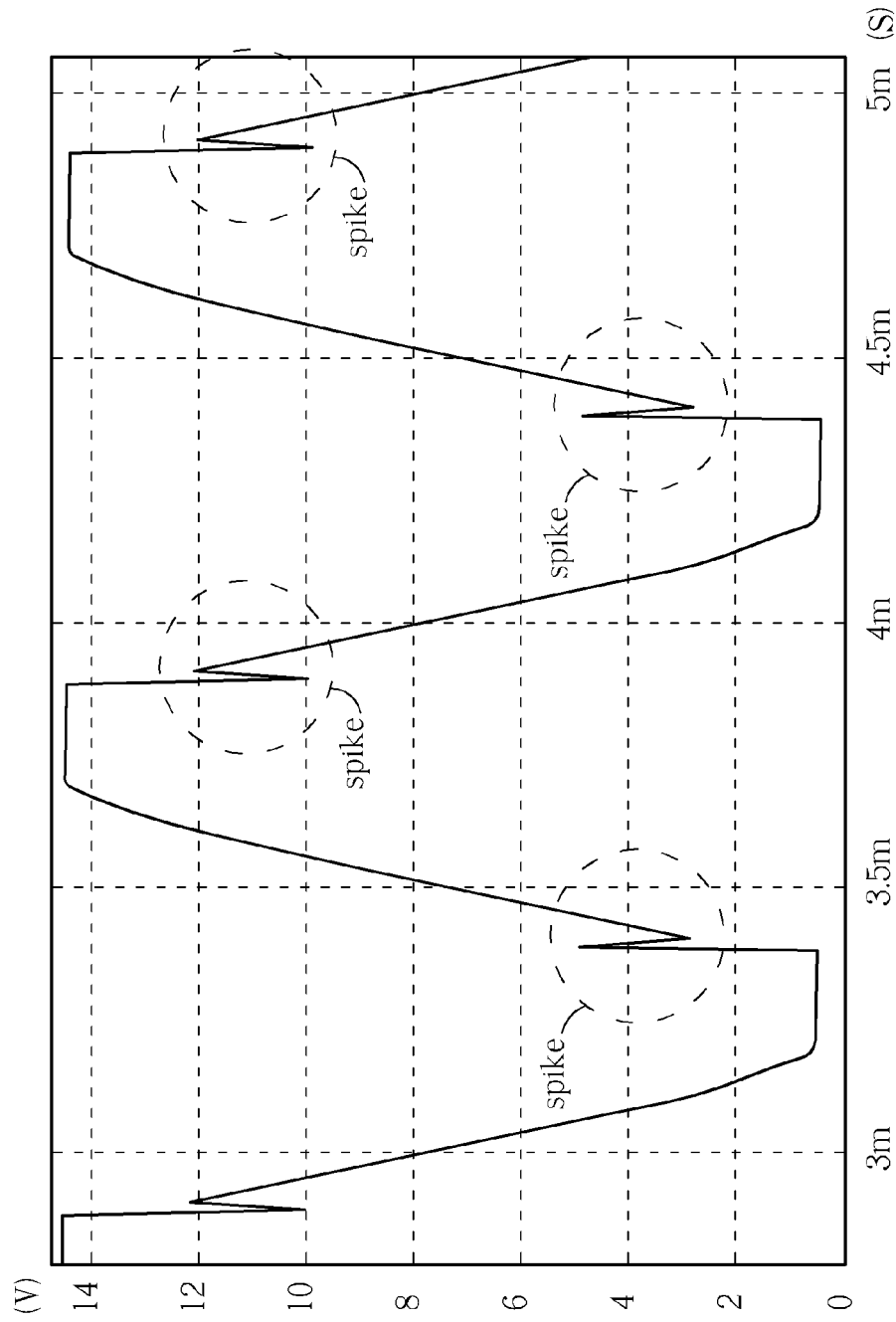
FIG. 2A is a diagram illustrating the audio signal exhibiting spikes when an amplitude of the input signal is increased gradually.
Figure 2B:
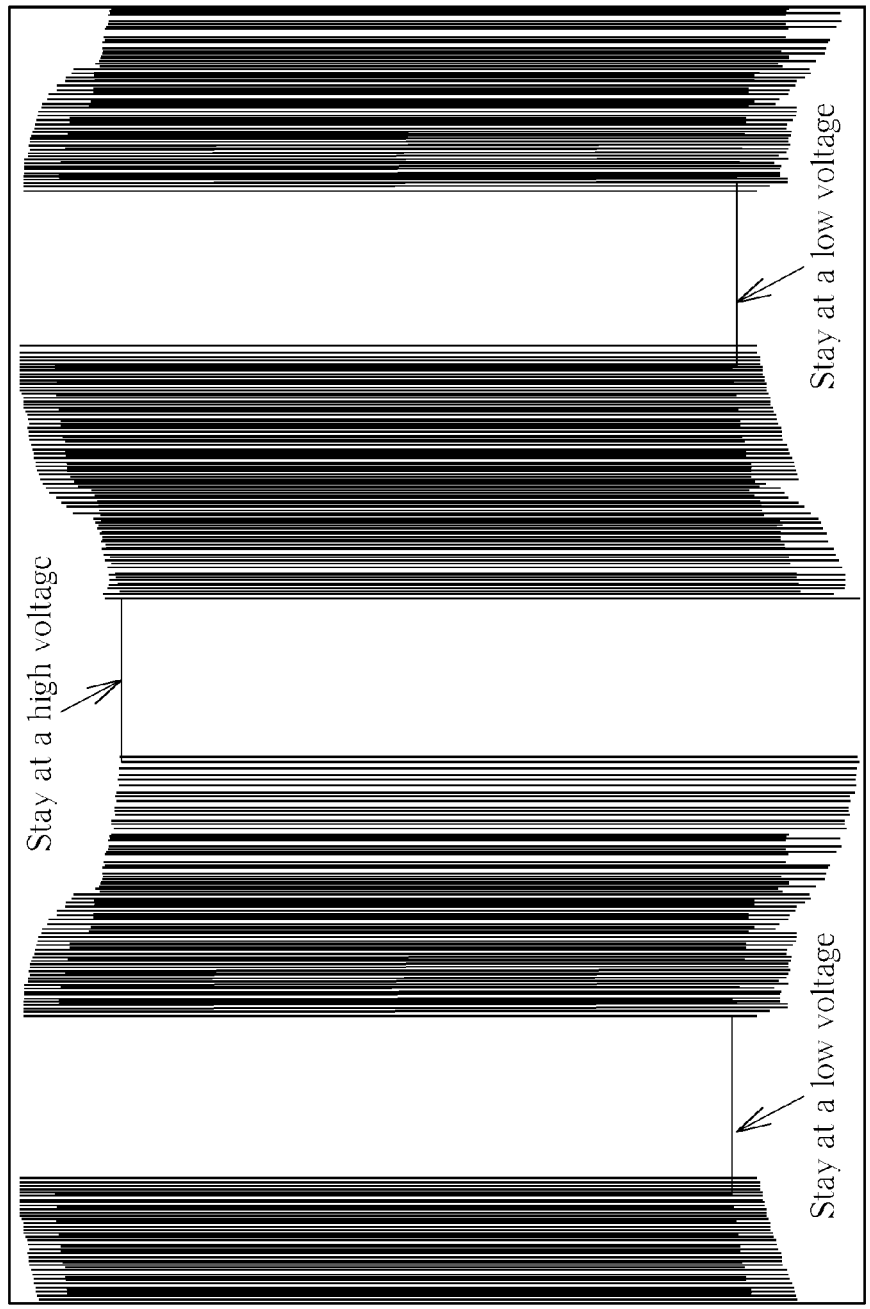
FIG. 2B is a diagram illustrating pulse width modulation of the output signal being stopped when the amplitude of the input signal is increased gradually.
Figure 3:
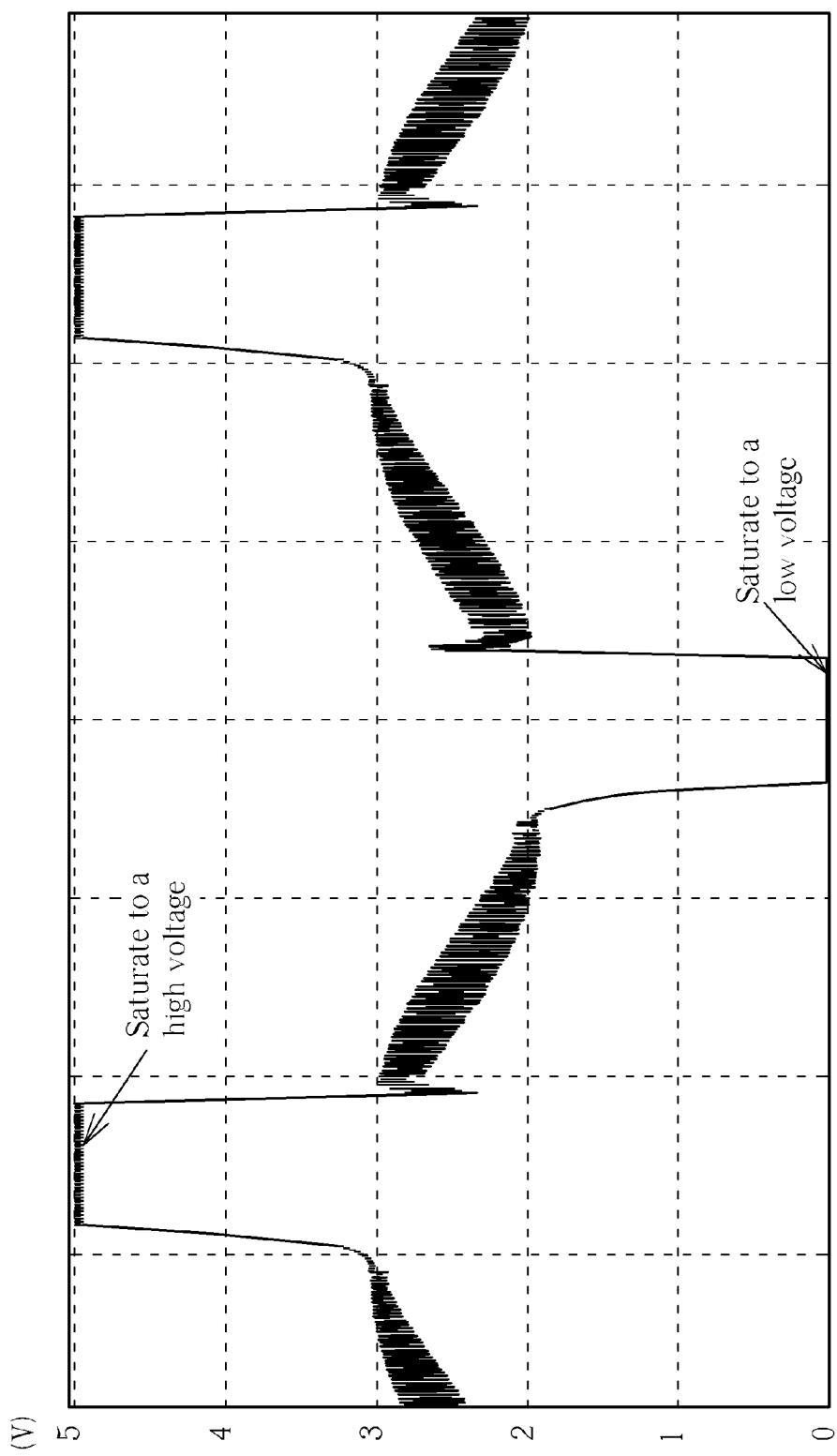
FIG. 3 is a diagram illustrating the first voltage signal outputted by the integration module being saturated to the high voltage or the low voltage.
Figure 4:
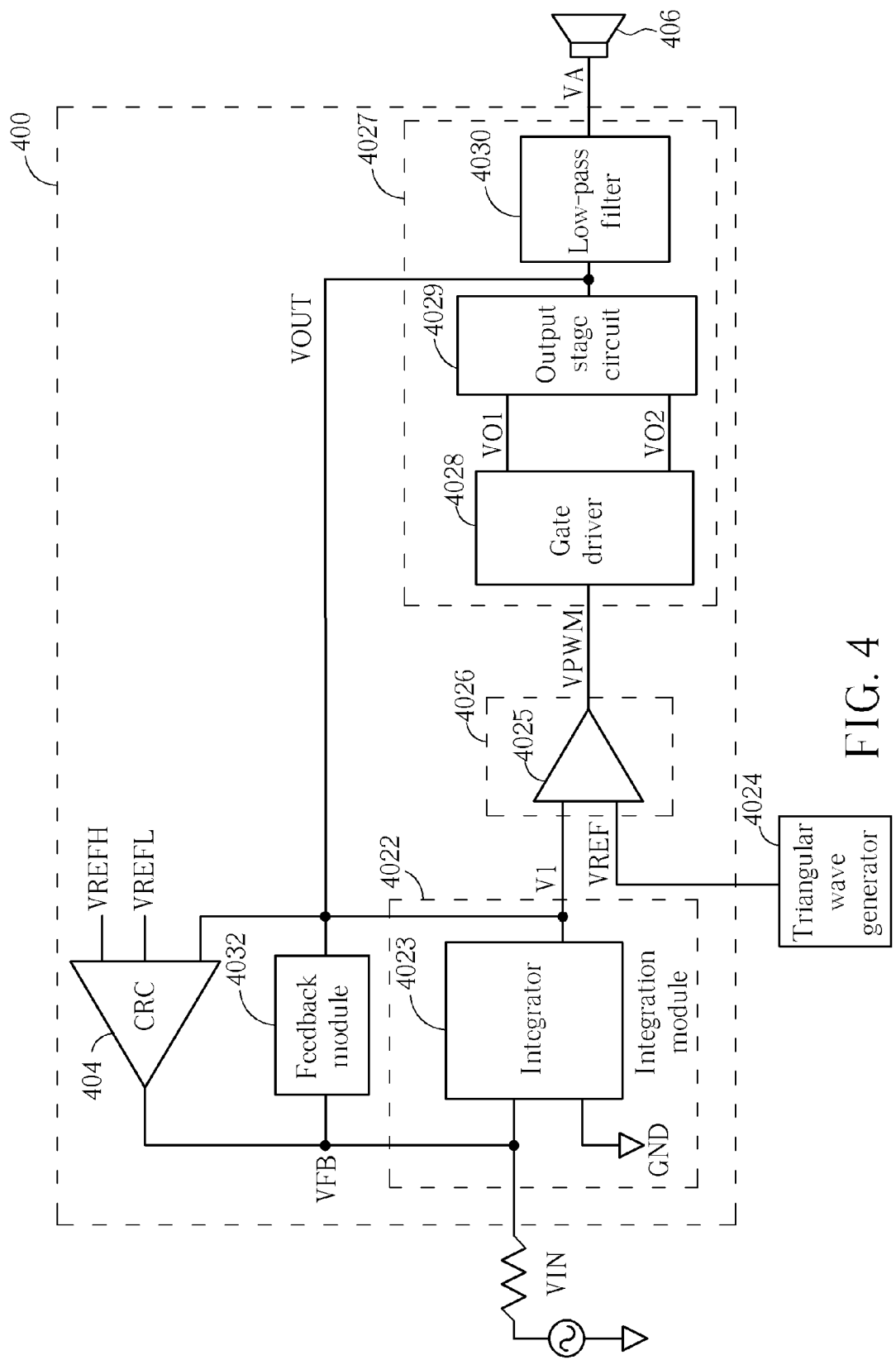
FIG. 4 is a diagram illustrating an amplifying circuit capable of suppressing spikes of an audio signal according to an embodiment.

Please refer to FIG. 4. FIG. 4 is a diagram illustrating an amplifying circuit 400 capable of suppressing spikes of an audio signal according to an embodiment. The amplifying circuit 400 includes an integration module 4022, a comparison module 4026, an output module 4027, a feedback module 4032, and a limiting module 404. The integration module 4022 is used for receiving an input signal VIN, and generating a first voltage signal V1 corresponding to the input signal VIN. The comparison module 4026 is coupled to the integration module 4022 for receiving the first voltage signal V1 and a reference signal VREF, and generating a comparison signal VPWM, where the reference signal VREF is a triangular wave signal generated by a triangular wave generator 4024, and the comparison signal VPWM is a pulse width modulation voltage. The output module 4027 is coupled to the comparison module 4026 for generating an audio signal VA according to the comparison signal VPWM, where the audio signal VA is used for driving a speaker 406. The feedback module 4032 is coupled between the output module 4027 and the integration module 4022 for feeding back an output signal VOUT to the integration module 4022, where the output signal VOUT is also a pulse width modulation voltage. The limiting module 404 is coupled between the integration module 4022 and the feedback module 4032 for limiting the comparison signal VPWM to be within a predetermined range.

The integration module 4022 includes an integrator 4023. A first terminal of the integrator 4023 is used for receiving the input signal VIN, a second terminal of the integrator 4023 is used for receiving a feedback voltage VFB generated by the feedback module 4032, a third terminal of the integrator 4023 is used for outputting the first voltage signal V1 corresponding to the input signal VIN, and a fourth terminal of the integrator 4023 is coupled to ground GND, where the integrator 4023 is a first order integrator. But, the present invention is not limited to the first order integrator, that is, the integrator 4023 can be also other order integrators.

The comparison module 4026 includes a comparator 4025. A first terminal of the comparator 4025 is coupled to the third terminal of the integrator 4023, a second terminal of the comparator 4025 is coupled to the triangular wave generator 4024, and an output terminal of the comparator 4025 is used for outputting the comparison signal VPWM, where the comparator 4025 is used for comparing the first voltage signal V1 with the triangular wave signal VT to output the comparison signal VPWM, and the comparator 4025 can be a hysteresis comparator.

The output module 4027 includes a gate driver 4028, an output stage circuit 4029, and a low-pass filter 4030. An input terminal of the gate driver 4028 is coupled to the output terminal of the comparator 4025 for receiving the comparison signal VPWM, a first output terminal of the gate driver 4028 is used for outputting a first output signal VO1, and a second output terminal of the gate driver 4028 is used for outputting a second output signal VO2. The gate driver 4028 generates the first output signal VO1 and the second output signal VO2 according to the comparison signal VPWM. A first input terminal of the output stage circuit 4029 is coupled to the first output terminal of the gate driver 4028, a second input terminal of the output stage circuit 4029 is coupled to the second output terminal of the gate driver 4028, and an output terminal of the output stage circuit 4029 is used for outputting an output signal VOUT. The output stage circuit 4029 is used for generating the output signal VOUT according to the first output signal VO1 or the second output signal VO2, and the output signal VOUT is also a pulse width modulation voltage. The feedback module 4032 is coupled between the output terminal of the output stage circuit 4029 and the second terminal of the integrator 4023 for feeding back the output signal VOUT and generating the feedback voltage VFB to the second terminal of the integrator 4023. The low-pass filter 4030 is coupled to the output stage circuit 4029 for converting and filtering the output signal VOUT into the audio signal audio signal VA.

Figure 5A:
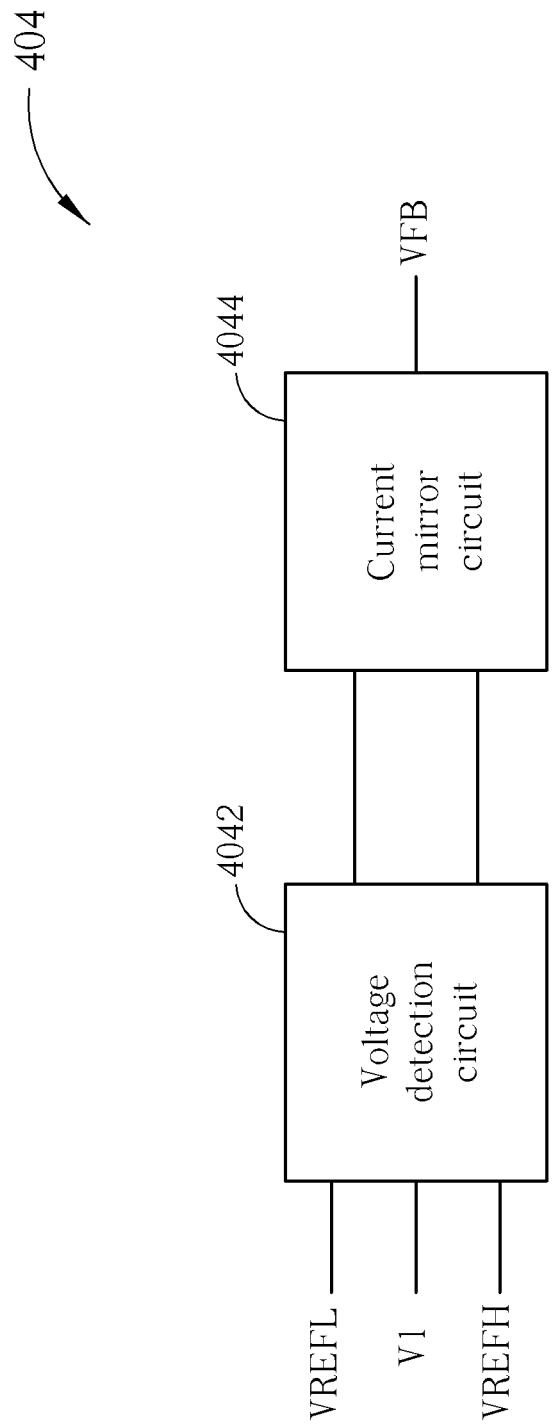
FIG. 5A is a diagram illustrating function blocks of the limiting module.
Figure 5B:
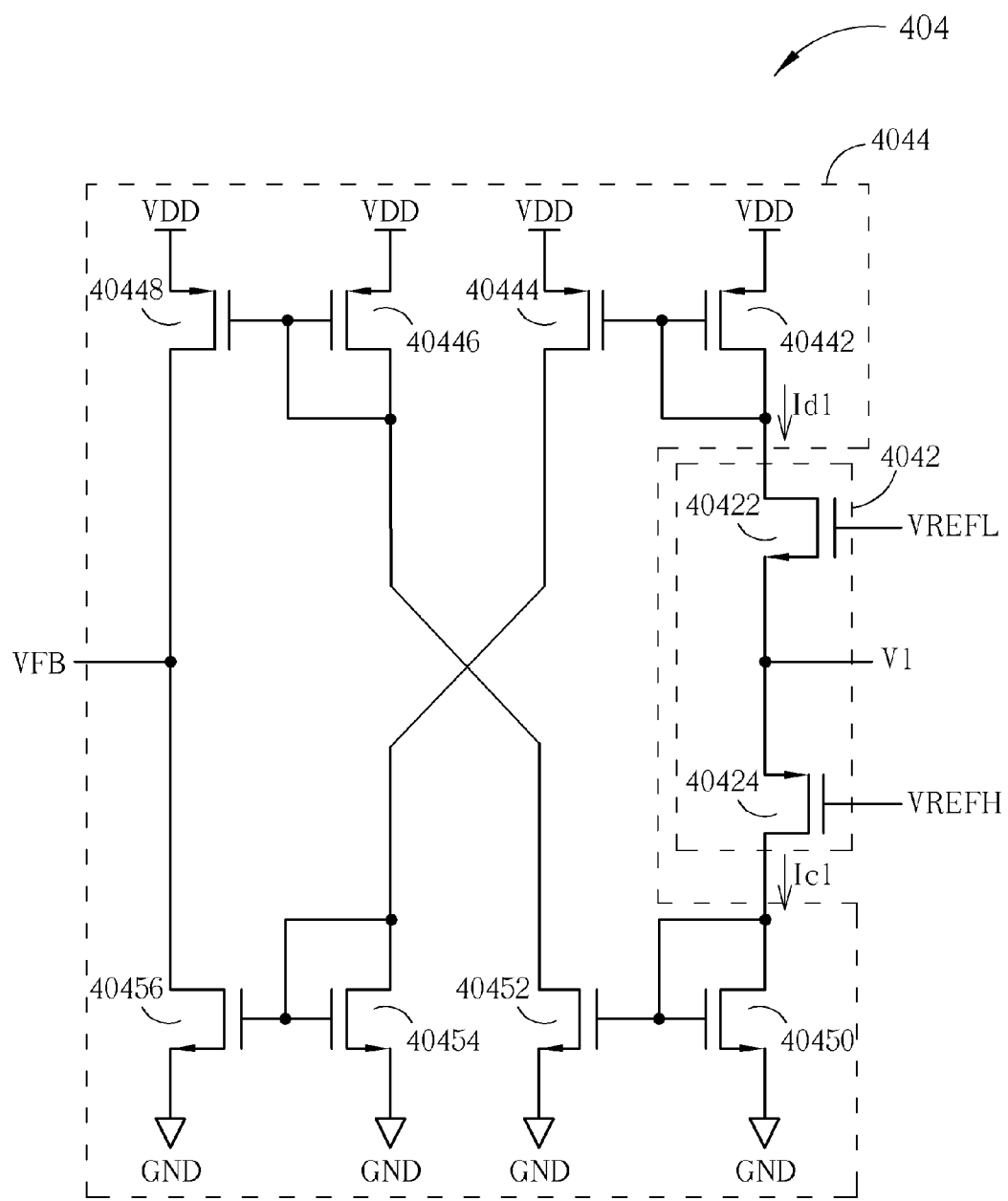
FIG. 5B is a diagram illustrating a structure of the limiting module.

Please refer to FIG. 5A and FIG. 5B. FIG. 5A is a diagram illustrating function blocks of the limiting module 404, and FIG. 5B is a diagram illustrating a structure of the limiting module 404. As shown in FIG. 5A, the limiting module 404 includes a voltage detection circuit 4042 and a current mirror circuit 4044. The voltage detection circuit 4042 is coupled to the integration module 4022. A first input terminal of the voltage detection circuit 4042 is used for receiving a high voltage reference signal VREFH, a second input terminal of the voltage detection circuit 4042 is used for receiving a low voltage reference signal VREFL, a third input terminal of the voltage detection circuit 4042 is used for receiving the first voltage signal V1, a first output terminal of the voltage detection circuit 4042 is used for sinking a discharge current Id1, and a second output terminal of the voltage detection circuit 4042 is used for outputting a charge current Ic1. A first terminal of the current mirror circuit 4044 is coupled to the first output terminal of the voltage detection circuit 4042, a second terminal of the current mirror circuit 4044 is coupled to the second output terminal of the voltage detection circuit 4042, and an output terminal of the current mirror circuit 4044 is coupled to the feedback module 4032.

As shown in FIG. 5B, the voltage detection circuit 4042 includes an N-type metal-oxide-semiconductor transistor 40422 and a P-type metal-oxide-semiconductor transistor 40424. A first terminal of the N-type metal-oxide-semiconductor transistor 40422 is coupled to the discharge current Id1, a second terminal of the N-type metal-oxide-semiconductor transistor 40422 is coupled to the low voltage reference signal VREFL, and a third terminal of the N-type metal-oxide-semiconductor transistor 40422 is coupled to the first voltage signal V1. A first terminal of the P-type metal-oxide-semiconductor transistor 40424 is coupled to the first voltage signal V1, a second terminal of the P-type metal-oxide-semiconductor transistor 40424 is coupled to the high voltage reference signal VREFH, and a third terminal of the P-type metal-oxide-semiconductor transistor 40424 is coupled to the charge current Ic1.

The current mirror circuit 4044 includes a first P-type metal-oxide-semiconductor transistor 40442, a second P-type metal-oxide-semiconductor transistor 40444, a third P-type metal-oxide-semiconductor transistor 40446, a fourth P-type metal-oxide-semiconductor transistor 40448, a third N-type metal-oxide-semiconductor transistor 40450, a fourth N-type metal-oxide-semiconductor transistor 40452, a fifth N-type metal-oxide-semiconductor transistor 40454, and a sixth N-type metal-oxide-semiconductor transistor 40456. A first terminal of the first P-type metal-oxide-semiconductor transistor 40442 is used for receiving a second voltage VDD, a second terminal of the first P-type metal-oxide-semiconductor transistor 40442 is coupled to the first terminal of the N-type metal-oxide-semiconductor transistor 40422, and a third terminal of the first P-type metal-oxide-semiconductor transistor 40442 is coupled to the second terminal of the first P-type metal-oxide-semiconductor transistor 40442. A first terminal of the second P-type metal-oxide-semiconductor transistor 40444 is used for receiving the second voltage VDD, and a second terminal of the second P-type metal-oxide-semiconductor transistor 40444 is coupled to the second terminal of the first P-type metal-oxide-semiconductor transistor 40442. A first terminal of the third P-type metal-oxide-semiconductor transistor 40446 is used for receiving the second voltage VDD, and a second terminal of the third P-type metal-oxide-semiconductor transistor 40446 is coupled to a third terminal of the third P-type metal-oxide-semiconductor transistor 40446. A first terminal of the fourth P-type metal-oxide-semiconductor transistor 40448 is used for receiving the second voltage VDD, a second terminal of the fourth P-type metal-oxide-semiconductor transistor 40448 is coupled to the second terminal of the third P-type metal-oxide-semiconductor transistor 40446, and a third terminal of the fourth P-type metal-oxide-semiconductor transistor 40448 is coupled to the feedback module 4032. A first terminal of the third N-type metal-oxide-semiconductor transistor 40450 is coupled to the charge current Ic1, a second terminal of the third N-type metal-oxide-semiconductor transistor 40450 is coupled to the first terminal of the third N-type metal-oxide-semiconductor transistor 40450, and a third terminal of the third N-type metal-oxide-semiconductor transistor 40450 is coupled to the ground GND. A first terminal of the fourth N-type metal-oxide-semiconductor transistor 40452 is coupled to the third terminal of the third P-type metal-oxide-semiconductor transistor 40446, a second terminal of the fourth N-type metal-oxide-semiconductor transistor 40452 is coupled to the second terminal of the third N-type metal-oxide-semiconductor transistor 40450, and a third terminal of the fourth N-type metal-oxide-semiconductor transistor 40452 is coupled to the ground GND. A first terminal of the fifth N-type metal-oxide-semiconductor transistor 40454 is coupled to the third terminal of the second P-type metal-oxide-semiconductor transistor 40444, a second terminal of the fifth N-type metal-oxide-semiconductor transistor 40454 is coupled to the first terminal of the fifth N-type metal-oxide-semiconductor transistor 40454, and a third terminal of the fifth N-type metal-oxide-semiconductor transistor 40454 is coupled to the ground GND. A first terminal of the sixth N-type metal-oxide-semiconductor transistor 40456 is coupled to the feedback module 4032, a second terminal of the sixth N-type metal-oxide-semiconductor transistor 40456 is coupled to the second terminal of the fifth N-type metal-oxide-semiconductor transistor 40454, and a third terminal of the sixth N-type metal-oxide-semiconductor transistor 40456 is coupled to the ground GND.

The voltage detection circuit 4042 and the current mirror circuit 4044 of the limiting module 404 can operate according to equation (1), equation (2), and equation (3):

$$VREFL - Vthn1 > V1 \qquad (1)$$

$$V1 > VREFH + Vthp1 \qquad (2)$$

$$VREFL - Vthn1 > V1 > VREFH + Vthp1 \qquad (3)$$

As shown in equation (1) and equation (2), Vthn1 is a threshold of the N-type metal-oxide-semiconductor transistor 40422, and Vthp1 is a threshold of the P-type metal-oxide-semiconductor transistor 40424. When the first voltage signal V1 outputted by the integrator 4023 satisfies equation (1) (that is, the first voltage signal V1 is too low), the N-type metal-oxide-semiconductor transistor 40422 is turned on and sinks the discharge current Id1. Then, the discharge current Id1 can discharge the second terminal of the integrator 4023 to decrease the feedback voltage VFB through a current mirror composed of the first P-type metal-oxide-semiconductor transistor 40442, the second P-type metal-oxide-semiconductor transistor 40444, the fifth N-type metal-oxide-semiconductor transistor 40454, and the sixth N-type metal-oxide-semiconductor transistor 40456 of the current mirror circuit 4044. Because the feedback voltage VFB is decreased, the first voltage signal V1 can be increased through a negative feedback of the integrator 4023. When the first voltage signal V1 outputted by the integrator 4023 satisfies equation (2) (that is, the first voltage signal V1 is too high), the P-type metal-oxide-semiconductor transistor 40424 is turned on and outputs the charge current Ic1. Then, the charge current Ic1 can charge the second terminal of the integrator 4023 to increase the feedback voltage VFB through a current mirror composed of the third P-type metal-oxide-semiconductor transistor 40446, the fourth P-type metal-oxide-semiconductor transistor 40448, the third N-type metal-oxide-semiconductor transistor 40450, and the fourth N-type metal-oxide-semiconductor transistor 40452 of the current mirror circuit 4044. Because the feedback voltage VFB is increased, the first voltage signal V1 can be decreased through the negative feedback of the integrator 4023. When the first voltage signal V1 outputted by the integrator 4023 satisfies equation (3), the limiting module 404 does not operate.

Figure 6A:
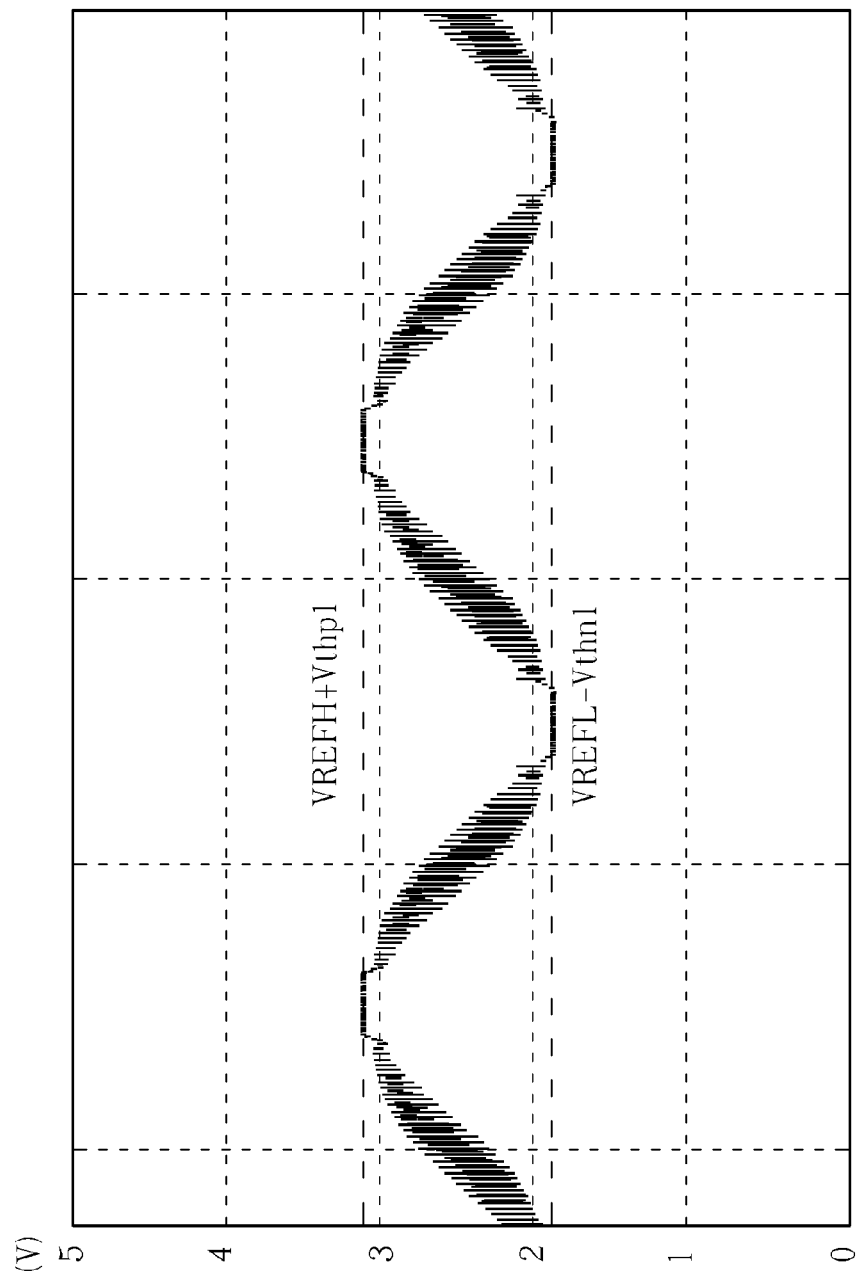
FIG. 6A is a diagram illustrating a waveform of the first voltage signal outputted by the integrator.
Figure 6B:
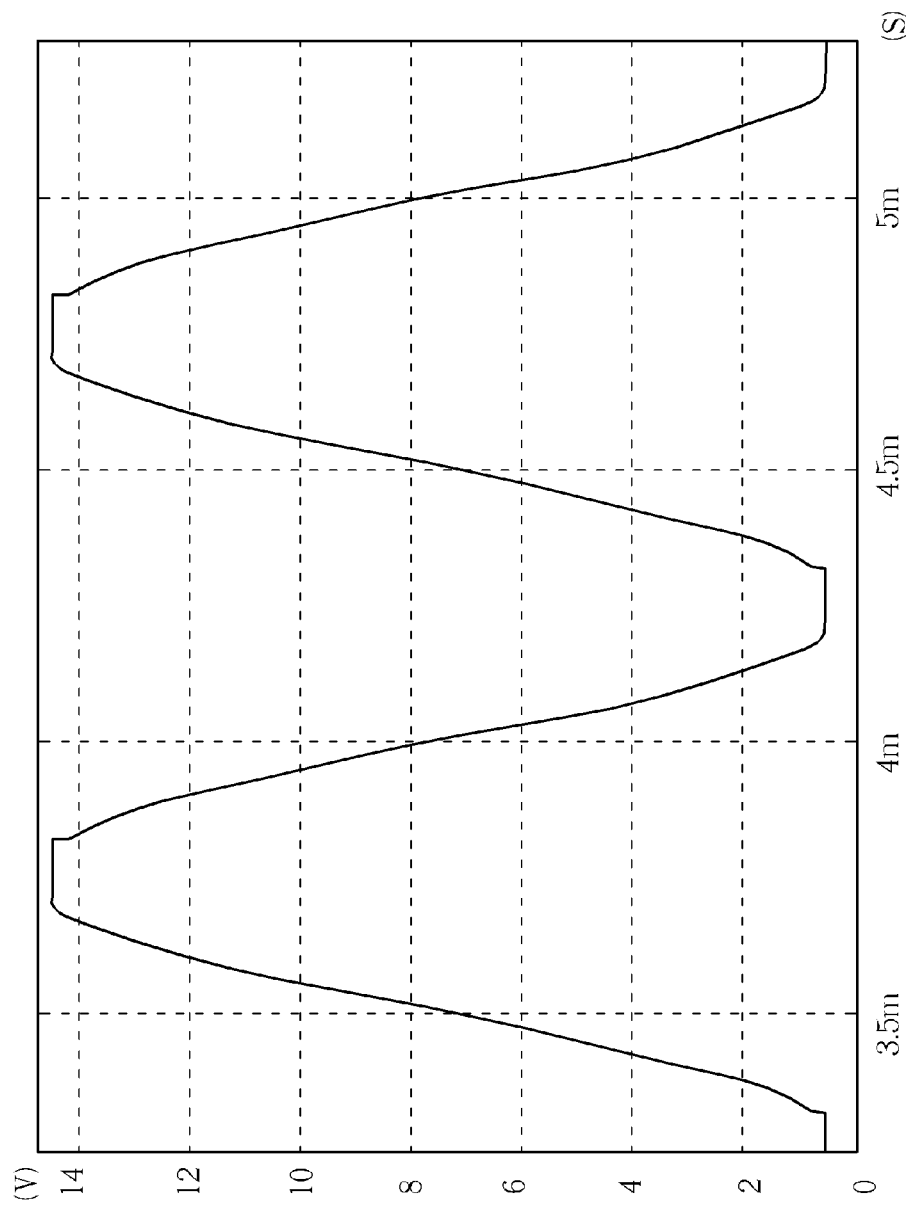
FIG. 6B is a diagram illustrating a waveform of the audio signal outputted by the low-pass filter.

Please refer to FIG. 6A and FIG. 6B. FIG. 6A is a diagram illustrating a waveform of the first voltage signal V1 outputted by the integrator 4023, and FIG. 6B is a diagram illustrating a waveform of the audio signal VA outputted by the low-pass filter 4030. As shown in FIG. 6A, upper and lower boundaries of the first voltage signal V1 can be limited to be within "the high voltage reference signal VREFH plus the threshold Vthp1 of the P-type metal-oxide-semiconductor transistor 40424" and "the low voltage reference signal VREFL minus the threshold Vthn1 of the N-type metal-oxide-semiconductor transistor 40422". Thus, as shown in FIG. 6B, the audio signal VA outputted by the low-pass filter 4030 does not exhibit the spikes, and distortion of the audio signal VA is reduced, so maximum output power of the amplifying circuit 400 is also increased.

Figure 7:
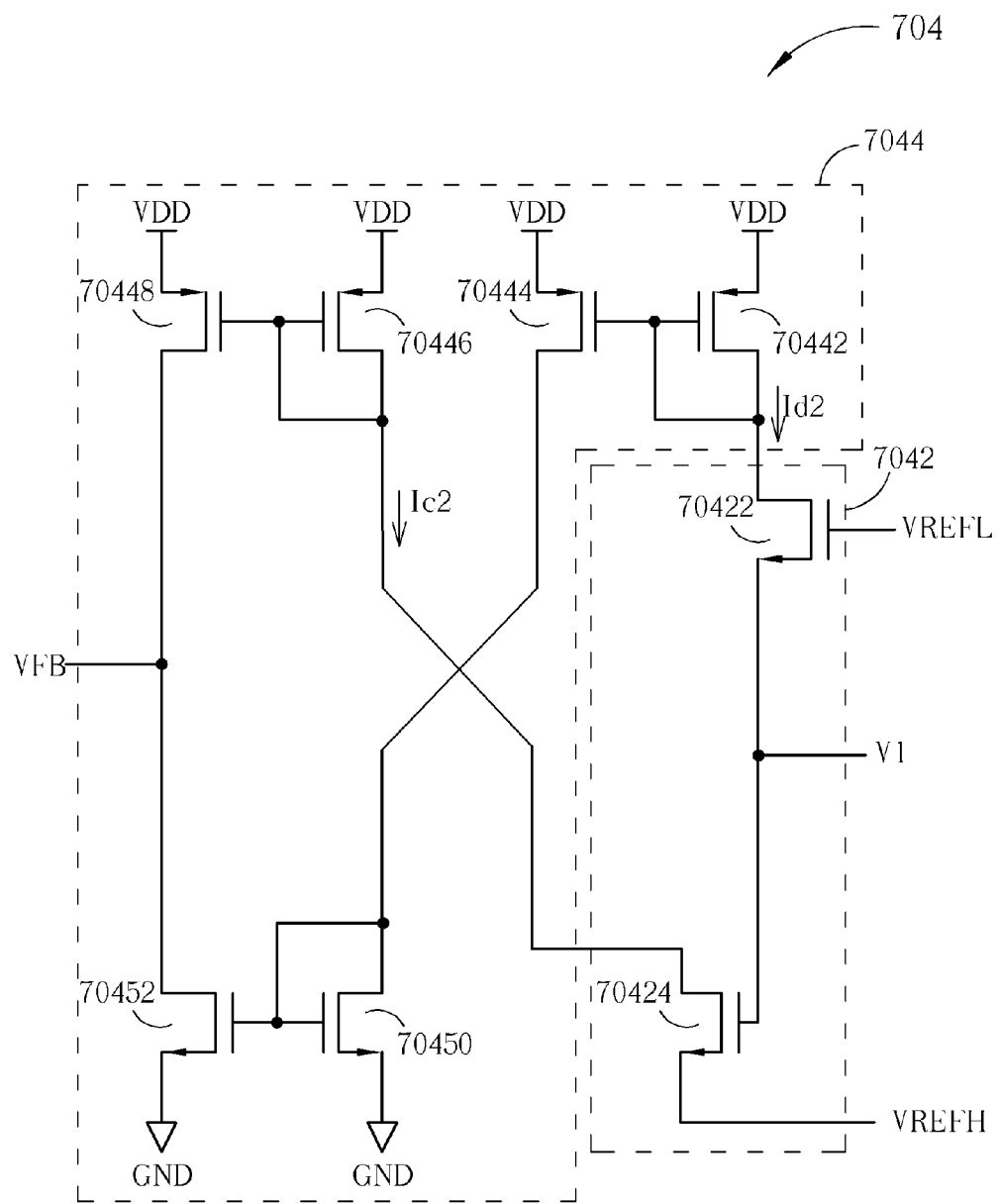
FIG. 7 is a diagram illustrating a structure of the limiting module according to another embodiment.

Please refer to FIG. 7. FIG. 7 is a diagram illustrating a structure of the limiting module 704 according to another embodiment. The limiting module 704 includes a voltage detection circuit 7042 and a current mirror circuit 7044, where coupling relationships between the voltage detection circuit 7042 and the current mirror circuit 7044 are the same as coupling relationships between the voltage detection circuit 4042 and the current mirror circuit 4044 in FIG. 5A, so further description thereof is omitted for simplicity. The voltage detection circuit 7042 includes a first N-type metal-oxide-semiconductor transistor 70422 and a second N-type metal-oxide-semiconductor transistor 70424. A first terminal of the first N-type metal-oxide-semiconductor transistor 70422 is used for sinking a discharge current Id2, a second terminal of the first N-type metal-oxide-semiconductor transistor 70422 is coupled to the low voltage reference signal VREFL, and a third terminal of the first N-type metal-oxide-semiconductor transistor 70422 is coupled to the first voltage signal V1. A first terminal of the second N-type metal-oxide-semiconductor transistor 70424 is used for sinking a charge current Ic2, a second terminal of the second N-type metal-oxide-semiconductor transistor 70424 is coupled to the first voltage signal V1, and a third terminal of the second N-type metal-oxide-semiconductor transistor 70424 is coupled to the high voltage reference signal VREFH.

The current mirror circuit 7044 includes a first P-type metal-oxide-semiconductor transistor 70442, a second P-type metal-oxide-semiconductor transistor 70444, a third P-type metal-oxide-semiconductor transistor 70446, a fourth P-type metal-oxide-semiconductor transistor 70448, a third N-type metal-oxide-semiconductor transistor 70450, and a fourth N-type metal-oxide-semiconductor transistor 70452. A first terminal of the first P-type metal-oxide-semiconductor transistor 70442 is used for receiving the second voltage VDD, a second terminal of the first P-type metal-oxide-semiconductor transistor 70442 is coupled to the first terminal of the first N-type metal-oxide-semiconductor transistor 70422, and a third terminal of the first P-type metal-oxide-semiconductor transistor 70442 is coupled to the second terminal of the first P-type metal-oxide-semiconductor transistor 70442. A first terminal of the second P-type metal-oxide-semiconductor transistor 70444 is used for receiving the second voltage VDD, and a second terminal of the second P-type metal-oxide-semiconductor transistor 70444 is coupled to the second terminal of the first P-type metal-oxide-semiconductor transistor 70442. A first terminal of the third P-type metal-oxide-semiconductor transistor 70446 is used for receiving the second voltage VDD, and the third terminal of the third P-type metal-oxide-semiconductor transistor 70446 is coupled to the second terminal of the third P-type metal-oxide-semiconductor transistor 70446 and the first terminal of the second N-type metal-oxide-semiconductor transistor 70424. A first terminal of the fourth P-type metal-oxide-semiconductor transistor 70448 is used for receiving the second voltage VDD, a second terminal of the fourth P-type metal-oxide-semiconductor transistor 70448 is coupled to the second terminal of the third P-type metal-oxide-semiconductor transistor 70446, and a third terminal of the fourth P-type metal-oxide-semiconductor transistor 70448 is coupled to the feedback module 4032. A first terminal of the third N-type metal-oxide-semiconductor transistor 70450 is coupled to the third terminal of the second P-type metal-oxide-semiconductor transistor 70444, a second terminal of the third N-type metal-oxide-semiconductor transistor 70450 is coupled to the first terminal of the third N-type metal-oxide-semiconductor transistor 70450, and a third terminal of the third N-type metal-oxide-semiconductor transistor 70450 is coupled to the ground GND. A first terminal of the fourth N-type metal-oxide-semiconductor transistor 70452 is coupled to the third terminal of the fourth P-type metal-oxide-semiconductor transistor 70448, a second terminal of the fourth N-type metal-oxide-semiconductor transistor 70452 is coupled to the second terminal of the third N-type metal-oxide-semiconductor transistor 70450, and a third terminal of the fourth N-type metal-oxide-semiconductor transistor 70452 is coupled to the ground GND.

The voltage detection circuit 7042 and the current mirror circuit 7044 of the limiting module 704 can operate according to equation (4), equation (5), and equation (6):

$$VREFL - Vthn2 > V1 \quad (4)$$

$$V1 > VREFH + Vthn3 \quad (5)$$

$$VREFL - Vthn2 > V1 > VREFH + Vthn3 \quad (6)$$

As shown in equation (4) and equation (5), Vthn2 is a threshold of the first N-type metal-oxide-semiconductor transistor 70422, and Vthn3 is a threshold of the second N-type metal-oxide-semiconductor transistor 70424. When the first voltage signal V1 outputted by the integrator 4023 satisfies equation (4) (that is, the first voltage signal V1 is too low), the first N-type metal-oxide-semiconductor transistor 70422 is turned on and sinks the discharge current Id2. Then, the discharge current Id2 can discharge the second terminal of the integrator 4023 to decrease the feedback voltage VFB through a current mirror composed of the first P-type metal-oxide-semiconductor transistor 70442, the second P-type metal-oxide-semiconductor transistor 70444, the third N-type metal-oxide-semiconductor transistor 70450, and the fourth N-type metal-oxide-semiconductor transistor 70452 of the current mirror circuit 7044. Because the feedback voltage VFB is decreased, the first voltage signal V1 can be increased through the negative feedback of the integrator 4023. When the first voltage signal V1 outputted by the integrator 4023 satisfies equation (5) (that is, the first voltage signal V1 is too high), the second N-type metal-oxide-semiconductor transistor 70424 is turned on and sinks the charge current Ic2. Then, the charge current Ic2 can charge the second terminal of the integrator 4023 to increase the feedback voltage VFB through a current mirror composed of the third P-type metal-oxide-semiconductor transistor 70446 and the fourth P-type metal-oxide-semiconductor transistor 70448 of the current mirror circuit 7044. Because the feedback voltage VFB is increased, the first voltage signal V1 can be decreased through the negative feedback of the integrator 4023. When the first voltage signal V1 outputted by the integrator 4023 satisfies equation (6), the limiting module 704 does not operate.

To sum up, the amplifying circuit capable of suppressing spikes of an audio signal utilizes the limiting module to limit a first voltage signal outputted by the integration module to be within the predetermined range. That is to say, the first voltage signal outputted by the integration module is not saturated to the second voltage (VDD) and the ground. Therefore, an audio signal outputted by the low-pass filter of the amplifying circuit does not include spikes, and distortion of the audio signal is reduced. In addition, the present invention can also increase maximum output power of the amplifying circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifying circuit capable of suppressing spikes of an audio signal, the amplifying circuit comprising:
   an integration module for receiving an input signal, and generating a first voltage signal corresponding to the input signal;
   a comparison module coupled to the integration module for receiving the first voltage signal and a reference signal, and generating a comparison signal;
   an output module coupled to the comparison module for generating the audio signal according to the comparison signal;
   a feedback module coupled between the output module and the integration module for feeding back an output signal to the integration module; and
   a limiting module coupled between the integration module and the feedback module for limiting the comparison signal to be within a predetermined range, the limiting module comprising:
      a voltage detection circuit comprising:
         an N-type metal-oxide-semiconductor transistor having a first terminal coupled to sink a discharge current, a second terminal coupled to a low voltage reference signal, and a third terminal coupled to the first voltage signal; and
         a P-type metal-oxide-semiconductor transistor having a first terminal coupled to the first voltage signal, a second terminal coupled to a high voltage reference signal, and a third terminal coupled to output a charge current; and
      a current mirror circuit having a first terminal of the current mirror circuit coupled to the first output terminal of the voltage detection circuit, a second terminal of the current mirror circuit coupled to the second output terminal of the voltage detection circuit, and an output terminal of the current mirror circuit coupled to the feedback module.

2. The amplifying circuit of claim 1,
   wherein the integration module comprises:
      an integrator, a first terminal of the integrator for receiving the input signal, a second terminal of the integrator for receiving a feedback voltage generated by the feedback module, a third terminal of the integrator for outputting the first voltage signal corresponding to the input signal, and a fourth terminal of the integrator coupled to ground, wherein the reference signal is a triangular wave signal generated by a triangular wave generator; and the comparison module comprises:
a comparator, a first input terminal of the comparator coupled to the third terminal of the integrator, a second input terminal of the comparator coupled to the triangular wave generator, and an output terminal of the comparator for outputting the comparison signal, wherein the comparator compares the first voltage signal with the triangular wave signal to output the comparison signal.

3. The amplifying circuit of claim 1, wherein the output module comprises:
a gate driver for generating a first output signal and a second output signal according to the comparison signal, wherein a first input terminal of the gate driver coupled to the output terminal of the comparator is used for receiving the comparison signal, a first output terminal of the gate driver is used for outputting the first output signal, and a second output terminal of the gate driver is used for outputting the second output signal;
an output stage circuit, wherein a first input terminal of the output stage circuit is coupled to the first output terminal of the gate driver, a second input terminal of the output stage circuit is coupled to the second output terminal of the gate driver, and an output terminal of the output stage circuit is coupled to the feedback module for outputting the output signal; and
a low-pass filter coupled to the output stage circuit for converting and filtering the output signal into the audio signal.

4. The amplifying circuit of claim 1, wherein the current mirror circuit comprises:
a first P-type metal-oxide-semiconductor transistor having a first terminal for receiving a second voltage, a second terminal coupled to the first terminal of the N-type metal-oxide-semiconductor transistor, and a third terminal coupled to the second terminal of the first P-type metal-oxide-semiconductor transistor;
a second P-type metal-oxide-semiconductor transistor having a first terminal for receiving the second voltage, a second terminal coupled to the second terminal of the first P-type metal-oxide-semiconductor transistor, and a third terminal;
a third P-type metal-oxide-semiconductor transistor having a first terminal for receiving the second voltage, a second terminal, and a third terminal coupled to the second terminal of the third P-type metal-oxide-semiconductor transistor;
a fourth P-type metal-oxide-semiconductor transistor having a first terminal for receiving the second voltage, a second terminal coupled to the second terminal of the third P-type metal-oxide-semiconductor transistor, and a third terminal coupled to the feedback module;
a third N-type metal-oxide-semiconductor transistor having a first terminal coupled to the charge current, a second terminal coupled to the first terminal of the third N-type metal-oxide-semiconductor transistor, and a third terminal coupled to the ground;
a fourth N-type metal-oxide-semiconductor transistor having a first terminal coupled to the third terminal of the third P-type metal-oxide-semiconductor transistor, a second terminal coupled to the second terminal of the third N-type metal-oxide-semiconductor transistor, and a third terminal coupled to the ground;

a fifth N-type metal-oxide-semiconductor transistor having a first terminal coupled to the third terminal of the second P-type metal-oxide-semiconductor transistor, a second terminal coupled to the first terminal of the fifth N-type metal-oxide-semiconductor transistor, and a third terminal coupled to the ground; and
a sixth N-type metal-oxide-semiconductor transistor having a first terminal coupled to the feedback module, a second terminal coupled to the second terminal of the fifth N-type metal-oxide-semiconductor transistor, and a third terminal coupled to the ground.

5. An amplifying circuit capable of suppressing spikes of an audio signal, the amplifying circuit comprising:
an integration module for receiving an input signal, and generating a first voltage signal corresponding to the input signal;
a comparison module coupled to the integration module for receiving the first voltage signal and a reference signal, and generating a comparison signal;
an output module coupled to the comparison module for generating the audio signal according to the comparison signal;
a feedback module coupled between the output module and the integration module for feeding back an output signal to the integration module; and
a limiting module coupled between the integration module and the feedback module for limiting the comparison signal to be within a predetermined range, the limiting module comprising:
a voltage detection circuit comprising:
a first N-type metal-oxide-semiconductor transistor having a first terminal coupled to sink a discharge current, a second terminal coupled to a low voltage reference signal, and a third terminal coupled to the first voltage signal; and
a second N-type metal-oxide-semiconductor transistor having a first terminal coupled to output a charge current, a second terminal coupled to the first voltage signal, and a third terminal coupled to a high voltage reference signal; and
a current mirror circuit having a first terminal of the current mirror circuit coupled to the first output terminal of the voltage detection circuit, a second terminal of the current mirror circuit coupled to the second output terminal of the voltage detection circuit, and an output terminal of the current mirror circuit coupled to the feedback module.

6. The amplifying circuit of claim 5, wherein the current mirror circuit comprises:
a first P-type metal-oxide-semiconductor transistor having a first terminal for receiving a second voltage, a second terminal coupled to the first terminal of the first N-type metal-oxide-semiconductor transistor, and a third terminal coupled to the second terminal of the first P-type metal-oxide-semiconductor transistor;
a second P-type metal-oxide-semiconductor transistor having a first terminal for receiving the second voltage, a second terminal coupled to the second terminal of the first P-type metal-oxide-semiconductor transistor, and a third terminal;
a third P-type metal-oxide-semiconductor transistor having a first terminal for receiving the second voltage, a second terminal, and a third terminal coupled to the second terminal of the third P-type metal-oxide-semiconductor transistor and the first terminal of the second N-type metal-oxide-semiconductor transistor;

a fourth P-type metal-oxide-semiconductor transistor having a first terminal for receiving the second voltage, a second terminal coupled to the second terminal of the third P-type metal-oxide-semiconductor transistor, and a third terminal coupled to the feedback module;

a third N-type metal-oxide-semiconductor transistor having a first terminal coupled to the third terminal of the second P-type metal-oxide-semiconductor transistor, a second terminal coupled to the first terminal of the third N-type metal-oxide-semiconductor transistor, and a third terminal coupled to the ground; and a fourth N-type metal-oxide-semiconductor transistor having a first terminal coupled to the third terminal of the fourth P-type metal-oxide-semiconductor transistor, a second terminal coupled to the second terminal of the third N-type metal-oxide-semiconductor transistor, and a third terminal coupled to the ground.

7. The amplifying circuit of claim 5, wherein the output signal is a pulse width modulation voltage.

8. The amplifying circuit of claim 5, wherein the comparison signal is a pulse width modulation voltage.

* * * * *